United States Patent
Shibata et al.

(10) Patent No.: US 8,461,026 B2
(45) Date of Patent: Jun. 11, 2013

(54) COMPOUND SEMICONDUCTOR LAMINATION, METHOD FOR MANUFACTURING THE SAME, AND SEMICONDUCTOR DEVICE

(75) Inventors: Yoshihiko Shibata, Tokyo (JP); Masatoshi Miyahara, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 852 days.

(21) Appl. No.: 12/532,377

(22) PCT Filed: Mar. 21, 2008

(86) PCT No.: PCT/JP2008/055275
§ 371 (c)(1),
(2), (4) Date: Sep. 21, 2009

(87) PCT Pub. No.: WO2008/123141
PCT Pub. Date: Oct. 16, 2008

(65) Prior Publication Data
US 2010/0090249 A1   Apr. 15, 2010

(30) Foreign Application Priority Data
Mar. 23, 2007   (JP) ................. 2007-077724

(51) Int. Cl.
*H01L 39/267* (2006.01)
*H01L 21/20* (2006.01)
(52) U.S. Cl.
USPC ......................................... 438/478; 257/190
(58) Field of Classification Search
USPC ........................ 257/190, E29.081; 438/478
See application file for complete search history.

(56) References Cited

U.S. PATENT DOCUMENTS 5,385,864 A * 1/1995 Kawasaki et al. ............... 438/48
5,548,136 A * 8/1996 Asai ............................ 257/190

(Continued)

FOREIGN PATENT DOCUMENTS

EP    0 779 666 A2    6/1997
JP    2-161729       6/1990

(Continued)

OTHER PUBLICATIONS

National Technical Report, vol. 42, No. 4, p. 86 in pp. 84-92, 1996 and partial English translation.

(Continued)

*Primary Examiner* — Shaun Campbell
*Assistant Examiner* — Jordan Klein
(74) *Attorney, Agent, or Firm* — Morgan, Lewis & Bockius LLP (57) ABSTRACT

The present invention relates to a compound semiconductor lamination that enables an InSb film to be formed on an Si substrate and enables development of applications to magnetic sensors, such as Hall elements, magneto-resistance elements, etc., optical devices, such as infrared sensors, etc., and electronic devices, such as transistors, etc., to be provided industrially, and a method for manufacturing the compound semiconductor lamination. An active layer, which is a compound semiconductor that does not contain As, is directly formed on an Si substrate. As is present at an interface of the active layer and a single crystal layer of the Si substrate. The compound semiconductor contains at least nitrogen. The compound semiconductor is a single crystal thin film. The Si substrate is a bulk single crystal substrate or a thin film substrate with an uppermost layer being Si.

6 Claims, 6 Drawing Sheets

U.S. PATENT DOCUMENTS

| | | | |
|---|---|---|---|
| 5,760,426 A * | 6/1998 | Marx et al. | 257/190 |
| 6,372,981 B1 * | 4/2002 | Ueda et al. | 136/261 |
| 6,406,795 B1 * | 6/2002 | Hwang et al. | 428/457 |
| 6,746,777 B1 * | 6/2004 | Hwang | 428/457 |
| 6,836,500 B2 * | 12/2004 | Borchert | 372/101 |
| 6,911,716 B2 * | 6/2005 | Chen et al. | 257/586 |
| 7,015,497 B1 * | 3/2006 | Berger | 257/14 |
| 2006/0246692 A1 | 11/2006 | Shibata et al. | 438/483 |
| 2007/0235653 A1 * | 10/2007 | Buckle et al. | 250/370.08 |

FOREIGN PATENT DOCUMENTS

| | | |
|---|---|---|
| JP | 7-29825 | 1/1995 |
| JP | 7-37806 | 2/1995 |
| JP | 7-94409 | 4/1995 |
| JP | 7-249577 | 9/1995 |
| JP | 9-162125 | 6/1997 |
| JP | 7-37819 | 2/1999 |
| WO | WO 2004/077585 | 10/2004 |
| WO | 2006013344 A1 | 2/2006 |

OTHER PUBLICATIONS

Morita, Y. et al.; Formation of Hydrogen Terminated Silicon Surfaces, Jouranl of the Surface Science Society of Japan, vol. 20, No. 10, pp. 680-684, 1999 and partial English translation.

Rao et al., How Si(001)-4 X 3—In Reconstruction Improves the Epitaxial Quality of InSb Films Grown on Si(001) Substrates, Surface Science (2001) 493:405-413.

Cho et al., Surface Electronic States of Low-Temperature H-Plasma Cleaned Si(100), Applied Physics Letters (1995) 59:1995-1997.

de Lyon et al.—MBE Growth of HgCdTe on Silicon Substrates for Large-Area Infrared Focal Plane Arrays: A Review of Recent Progress, Journal of Electronic Materials (1999) 28:705-711.

European Patent Application No. EP08738698—Supplementary European Search Report.

* cited by examiner

COMPOUND SEMICONDUCTOR LAMINATION, METHOD FOR MANUFACTURING THE SAME, AND SEMICONDUCTOR DEVICE

TECHNICAL FIELD

The present invention relates to a compound semiconductor lamination, a method for manufacturing the same, and a semiconductor device, and to be more detailed, relates to a compound semiconductor lamination in which a compound semiconductor active layer is formed on an Si substrate, a method for manufacturing the compound semiconductor lamination, and a semiconductor device that uses the compound semiconductor lamination and that may be an electronic device, a magnetic sensor, a Hall element, or an optical device.

BACKGROUND ART

There are many compound semiconductor stacked bodies that are industrially useful, and magnetic sensors, such as Hall elements, magneto-resistance effect elements, etc., that use InSb as an active layer are already being put to practical use. Further, in addition to infrared sensors that use InSb, application to transistors is being researched actively in recent years. Optical devices using a nitride, such as GaN, etc., as the active layer are becoming practicable.

It is difficult to produce a bulk single crystal of a compound semiconductor, such as InSb, GaN, etc., and thus normally, these compound semiconductors have been put to use in the form of a thin film formed on a GaAs substrate, Si substrate, or sapphire substrate.

Si substrates that are larger in diameter and far inexpensive in comparison to GaAs substrates and sapphire substrates are supplied to the market with stability. Also in consideration of transistor applications, growth on Si substrates is important for integration.

Forming of a compound semiconductor film on a Si substrate is considered to be technically difficult. For example, in the case of InSb, a complex process is required as disclosed in Patent Document 1. That is, first, Si is hydrogen terminated, and an underlayer of In, etc., formed in vacuum at a low temperature. A pre-deposition layer, made of In and Sb, is then formed on the underlayer. Further, an InSb layer is formed on the pre-deposition layer at a temperature higher than the temperature at which the above layers were formed, and the process is thus complex.

Further, the InSb film obtained by such a method is inadequate in terms of characteristics, and at a thickness of 4 μm, although the electron mobility takes on a high value of 50,000 $cm^2/Vs$, the Hall coefficient is only approximately 320 $cm^3/C$ to 480 $cm^3/C$.

Normally, the performance of a semiconductor film is evaluated by a value determined by dividing the Hall coefficient by the film thickness. The characteristic determined by dividing by the film thickness is 800,000 $cm^2/C$ to 1,200,00 $cm^2/C$. This numerical value indicates that a large amount of defect-induced carriers is contained. Although application to a magneto-resistance effect element that makes use of the high electron mobility is possible, application to a Hall element or a transistor, with which the defects present a problem, is difficult. Also, even with a magneto-resistance effect element, although it is known that temperature characteristics can be improved by doping of an n-type dopant, the resistance becomes too small when doping is performed because a high amount of carriers is present originally, and thus with the InSb film described above, improvement in the temperature characteristics by doping is substantially difficult.

As a countermeasure for the above, for example, by first forming a GaAs layer on an Si substrate and then forming an InSb film on the GaAs layer as disclosed in Patent Document 2, the characteristics of the InSb film can be improved significantly such that the Hall coefficient is approximately 370 cm3/C at a film thickness of 1 μm and the value divided by the film thickness is 3,700,000 cm2/C. However, the forming of the GaAs layer on the Si substrate requires a higher temperature than that at which the InSb film is formed, and for application to a transistor, etc., it is more preferable to directly form the InSb film on the Si substrate. Although there is thus a need to form a compound semiconductor, which serves as an active layer of high quality, directly on an Si substrate, this is difficult to achieve with the conventional arts.

The present invention has been made in view of the above circumstances, and an object thereof is to provide a compound semiconductor lamination that enables an InSb or other compound semiconductor film to be formed directly on an Si substrate to industrially promote development of applications to magnetic sensors, such as Hall elements, magneto-resistance elements, etc., optical devices, such as infrared sensors, etc., and electronic devices, such as transistors, etc., and to provide a method for manufacturing the compound semiconductor lamination and a semiconductor device.

Patent Document 1: Japanese Patent Laid-Open No. H7-249577 (1995)

Patent Document 2: International Patent Publication No. WO2004/077585 Pamphlet

Non-Patent Document 1: 1996 National Technical Report, Vol. 42, No. 4, p. 86 in pp. 84-92.

Non-Patent Document 2: Journal of the Surface Science Society of Japan, Vol. 20, No. 10, pp. 680-684 (1999).

DISCLOSURE OF THE INVENTION

As a result of diligent study, the inventors found that a compound semiconductor film of extremely high quality can be formed on an Si substrate by precedent irradiating As onto a hydrogen-terminated Si substrate and then irradiating a constituent substance of the compound semiconductor onto the Si substrate.

For example with an InSb film, although it is considered that normally when an InSb film is formed on an Si substrate, only a polycrystalline film can be formed with a simple, single-stage growth as disclosed for example in Non-Patent Document 1, it has been confirmed that by using the manufacturing method of the present invention, a single crystal InSb film of high quality is obtained with a single-stage growth in which the substrate temperature is kept fixed during the growth, or even with a two-stage growth in which initial growth is performed at a low temperature, and this has lead to the realization of the present invention.

To accomplish the object of the present invention, the present invention provides a compound semiconductor lamination that is characterized in that in a compound semiconductor lamination, formed by directly forming InxGayAlzSb (where each of x, y, and z is equal to or more than 0 and equal to or less than 1) on an Si substrate, As is present at an interface of the compound semiconductor layer and the Si substrate.

Also, the compound semiconductor lamination is characterized in that the compound semiconductor layer is an active layer.

Also, the compound semiconductor lamination is characterized in that the compound semiconductor is a single crystal thin film.

Also, the compound semiconductor lamination is characterized in that the Si substrate is a bulk single crystal substrate or a thin film substrate with an uppermost layer being Si.

Also, the compound semiconductor lamination is characterized in that a film thickness of the active layer is equal to or more than 0.1 µm and equal to or less than 5 µm.

Also, the compound semiconductor lamination is characterized in that a surface area of the compound semiconductor lamination is equal to or more than 15 cm$^2$.

Also, the compound semiconductor lamination is characterized in that a crystal quality of the compound semiconductor layer is uniform at all positions.

A method for manufacturing a compound semiconductor lamination according to the present invention is a method for manufacturing a compound semiconductor lamination, whereby a compound semiconductor is formed on an Si substrate, and is characterized in that the Si substrate is hydrogen-terminated, As is then precedent irradiated onto the Si substrate, and then the compound semiconductor is formed by irradiating a constituent substance of the compound semiconductor.

Also, a method for manufacturing a compound semiconductor lamination, whereby a compound semiconductor is formed on an Si substrate, is characterized in that the Si substrate is hydrogen-terminated, As is then made present in an ambient atmosphere without irradiating the As directly onto the Si substrate, and then irradiating a constituent substance of the compound semiconductor before the terminally-attached hydrogen becomes desorbed and forming the compound semiconductor.

Also, the method for manufacturing the compound semiconductor lamination is characterized in that after forming a thin film by irradiating the constituent substance of the compound semiconductor onto the Si substrate, a temperature of the Si substrate is raised and then the constituent substance of the compound semiconductor is irradiated.

Also, the method for manufacturing the compound semiconductor lamination is characterized in that the Si substrate is a bulk single crystal substrate or a thin film substrate with an uppermost layer being Si.

A semiconductor device according to the present invention is characterized in that an ohmic electrode is formed on the above-described compound semiconductor lamination.

Also, the semiconductor device is characterized in being an electronic device, a magnetic sensor, a Hall element, or an optical device.

That a compound semiconductor of extremely high quality is obtained even in a single-stage growth by the present invention attributes to the presence of the precedent irradiated As at the interface of the compound semiconductor layer and the Si substrate. As is irradiated precedent, and despite the supply of As being stopped before forming of an InSb film, it was confirmed by performing elemental analysis in a depth direction of the compound semiconductor film obtained that As is contained at the interface of the compound semiconductor and Si. Further, it was confirmed that even when As is not directly irradiated onto the Si substrate but is simply made present in the ambient atmosphere, As is likewise contained at the interface of the compound semiconductor and Si. Cross-section evaluation by HRTEM (high-resolution transmission electron microscopy) showed that whereas a compound semiconductor film that is formed by a normal single-stage growth is already polycrystalline from the interface of the Si substrate and the compound semiconductor film and, in addition, exhibits many defects, with a compound semiconductor film formed by irradiating As precedent, the interface of the Si substrate and the compound semiconductor film is bonded smoothly at the atomic level and neither an amorphous structure nor a poly-crystal is seen at the interface. Also in comparison to the case without precedent irradiation of As, a trend of significantly less defects is seen. From the above, it is considered that As improves the interface of the compound semiconductor film and the Si substrate.

Preferable examples of the compound semiconductor layer according to the present invention include InSb, GaSb, AlSb, InxGayAlzSb (where each of x, y, and z is equal to or more than 0 and equal to or less than 1), etc.

Although the thickness of the compound semiconductor film according to the present invention is not restricted in particular, it is normally equal to or more than 0.1 µm and equal to or less than 5 µm, preferably equal to or more than 0.2 µm and equal to or less than 4 µm, more preferably equal to or more than 0.3 µm and equal to or less than 3 µm, and most preferably equal to or more than 0.35 µm and equal to or less than 1.5 µm. The substrate material is a bulk single crystal substrate or a thin film substrate with an uppermost layer being Si, and (111) and (100) are preferable plane orientations.

The Si single crystal layer must be terminated with hydrogen. Although a method for hydrogen termination is not restricted in particular, a hydrogen termination treatment is normally and generally performed by immersing a cleaned Si substrate in an aqueous ammonium fluoride solution or aqueous hydrogen fluoride solution as indicated in Non-Patent Document 2, etc.

A compound semiconductor single crystal film refers to a situation where the plane orientation of the Si substrate and the plane orientation of the compound semiconductor film are the same in both parallel and perpendicular directions. That a film is a single crystal film can normally be checked by a high-resolution X-ray diffraction method or by HRTEM (high-resolution transmission electron microscopy).

It is considered that the As at the interface of the compound semiconductor film and the Si substrate is bonded to Si or a group III element of the compound semiconductor. Although with the present invention, it is expressed that the compound semiconductor is formed directly on Si despite As being present at the interface, this means that the structure is not a three-layer structure in which the compound semiconductor, which is the third component, is formed to a certain thickness or more as a layer. In a case of a three-layer structure, it is considered that each layer must have a minimum thickness of at least approximately ten or more times a lattice constant to express functions as a layer, and whereas in many cases, a structure with a thickness of equal to or more than 10 nm is normally determined to be a layer, the As present at the interface in the present invention may be present not only in the form of a layer but may also be present in a localized manner. Normally when the interface of the Si and the compound semiconductor substrate is observed by HRTEM, a region that has several atomic layers, including a step of the substrate and is approximately 2 nm in thickness is considered to be the interface, and As is present in a localized manner within this range.

That As is present at the interface of the compound semiconductor and Si can be confirmed by secondary ion-microprobe mass spectroscopy (SIMS). Generally in SIMS, the position of an interface is defined as a point at which an intensity of a constituent atom of the compound semiconductor film becomes ½, a point at which the intensity of Si becomes ½, a midpoint of these two points, or a point at which the intensity of an element that is known to be present at a large amount at the interface (large amounts of C and O are normally contained at an interface of a substrate and a compound semiconductor formed by MBE or vapor deposition) becomes the maximum. When the structure of the present invention is analyzed, although a maximum value of As is observed near an interface of any of the general definitions given above, depending on the measurement conditions, there are case where the maximum value of As appears shifted from an interface of any of the above definitions. It can be determined that As is present in the active layer in this case as well.

If in the judgment of the presence of As at the interface, the intensity of As at the interface is higher than the intensity of As in the compound semiconductor film, it can be determined that As is present at the interface. Numerically speaking, the judgment that the intensity of As at the interface is higher than the intensity of As in the compound semiconductor film can be made, for example, when the intensity of As at the interface is higher than a value obtained by adding two times a standard deviation σ of variation due to statistical variation to the average intensity of As in the compound semiconductor film near the interface. However in actuality, even in a case where the intensity is less than the value obtained by adding two times σ, by plotting SIMS data in a graph and making a visual determination that As is higher than in the active layer, it can be determined that As is present at the interface. The average intensity is determined at a region at which a profile of As in the compound semiconductor is substantially fixed and does not change greatly.

The intensity may become high due to noise, etc., and although such noise must thus be eliminated, with such noise, the probability of the intensity being high at just one point is high, and thus for example in a case where the intensity is high at just one point or two points, this can be judged to be noise.

In regard to the SIMS apparatus and measurement conditions, for example, SIMS4100, made by Atomika Instruments GmbH, is used with a primary ion species being Cs+, an acceleration energy being 2 keV, a primary ion current being 8 nA, a primary ion beam incidence angle being 60 deg (with 0 being the vertical angle), a scan width being 200 µm, and detected ion species being As, an ion of an element making up the compound semiconductor, and an ion of an element making up the substrate, or a cluster ion of the above ions or a cluster ion of an above ion with the primary ion and being, for example, 75As−, 121Sb−, 30Si2−, etc., in the case where the compound semiconductor film is InSb and the substrate is Si. Or, Model IMS-6f, made by Cameca Inc., is used with the primary ion species being Cs+, a beam current being approximately 30 nA, an acceleration voltage being 3 kV, a scanning region being 125 (µm×µm), a detection region being φ30 µm, and the detected ion species being As, an ion of an element making up the compound semiconductor, and an ion of an element making up the substrate, or a cluster ion of the above ions and or a cluster ion of an above with the primary ion and being, for example, 133Cs75As+, 133Cs16O+, 133Cs113In+, 133Cs121Sb+, and 133Cs30Si+ in the case where the compound semiconductor film is InSb and the substrate is Si. Or, ADEPT 1010, made by Ulvac Phi Inc., is used with the primary ion species being Cs+, the acceleration energy being 250 eV, the primary ion current being 25 nA, the primary ion beam incidence angle being 75 deg (with 0 being the vertical angle), the scan width being 500 µm, and the detected ion species being As, an ion of an element making up the compound semiconductor, and an ion of an element making up the substrate, or a cluster ion of the above ions or a cluster ion of an above ion with the primary ion and being, for example, 75As−, 121Sb−, 30Si2−, etc., in the case where the compound semiconductor film is InSb and the substrate is Si, and although the above are representative examples, the present invention is not restricted just to the above.

Depending on the size and structure of the element, it may not be possible to employ the abovementioned conditions as the SIMS measurement conditions. In that case, the conditions suffice to be those enabling detection of ions that enable monitoring of In, Sb, Si, and As profiles at as low energy as possible and under conditions where the profile of As at the interface does not spread.

Although there is no upper limit to a precedent irradiation time of As (a time during which only As is irradiated), normally, no less than 0.5 seconds to no more than 60 seconds is often used. Before the irradiation of As, the hydrogen-terminated substrate is treated at high temperature to remove the hydrogen and obtain a clean, realigned Si surface and the forming of the compound semiconductor is generally performed on such a surface, in the present invention, a key point is to start the As irradiation and an initial or main growth before the terminally-attached hydrogen becomes desorbed. After the precedent irradiation of As, the forming of InSb is normally performed within 48 hours and in many cases performed within one hour. The irradiation amount is normally $10^{-4}$ to $10^{-9}$ Torr in the case where flux is measured with an ion gauge. The precedent irradiation of As also exhibits an effect even in a case where As is not irradiated onto the Si substrate directly. In this case, the As present in the ambient atmosphere is incorporated into the interface of the Si substrate and the compound semiconductor substrate that does not contain As. Conditions that are satisfactory are such that the amount of As present in the ambient atmosphere as measured by the ion gauge is normally more than $1 \times 10^{-10}$ mbar, preferably more than $1 \times 10^{-9}$ mbar, and more preferably more than $3 \times 10^{-9}$ mbar.

As is present in a gaseous state in the ambient atmosphere and its presence can thus be confirmed by a normal quadrupole mass analyzer. Also due to being gaseous, the uniformity is good during crystal growth and uniform crystal growth is possible even on a substrate of large area. That is, it is possible to make the crystal quality of the compound semiconductor layer uniform at all positions even when the area is equal to or more than 15 cm². Here, "all positions" refers to a situation where, for example in a case of a compound semiconductor layer with a diameter of 4 inches and an area of approximately 79 cm², the electron mobility at the center and a plurality of locations within 5 mm to the inner side from the edge of the substrate is such that, when σ is the variation, ±3σ falls within average ±10%.

Although the film forming method most suited for accomplishing the present invention is molecular beam epitaxy (MBE), the present invention can also be accomplished by atomic layer epitaxy, etc., and the method is not restricted in particular. In regard to the growth of the compound semiconductor film, single-stage growth may be performed at the abovementioned As irradiation temperature or two-stage growth upon raising the substrate temperature may be carried out. The ohmic electrode may be a known multilayer electrode of Au/Pt/Ti, etc., or may be a single-layer metal.

With the present invention, As is present at the interface of the active layer and the single crystal layer of the Si substrate in the compound semiconductor lamination, formed by directly forming the active layer, which is InxGayAlzSb (where each of x, y, and z is equal to or more than 0 and equal to or less than 1), on the Si substrate, thus enabling the forming of an InSb film on an Si substrate and enabling applications to be developed industrially to magnetic sensors, such as Hall elements, magneto-resistance elements, etc., optical devices, such as infrared sensors, etc., and electronic devices, such as transistors, etc.

BEST MODE FOR CARRYING OUT THE INVENTION

Best modes for carrying out the invention shall now be described with reference to the accompanied drawings.

Figure 1:
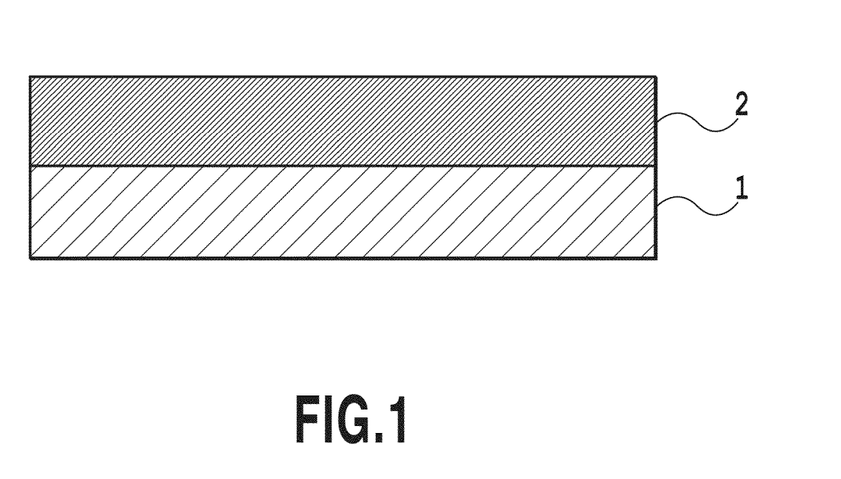
FIG. 1 is a schematic cross-sectional structural diagram of a compound semiconductor lamination according to the present invention.

FIG. 1 is a schematic cross-sectional structural diagram of a compound semiconductor lamination according to the present invention, and in the figure, the reference number 1 denotes an Si substrate and 2 denotes an InSb film (compound semiconductor layer). With the compound semiconductor lamination according to the present invention, $In_xGa_yAl_zSb$ (where each of x, y, and z is equal to or more than 0 and equal to or less than 1) is directly formed on the Si substrate 1. As is present at an interface of the compound semiconductor layer 2 and a single-crystal layer of the Si substrate 1.

The compound semiconductor is preferably $In_xGa_yAl_zSb$ (with each of x, y, and z being equal to or more than 0 and equal to or less than 1). Also, the compound semiconductor is preferably $In_xGa_yAl_zN$ (with each of x, y, and z being equal to or more than 0 and equal to or less than 1). Also, the compound semiconductor is preferably a single crystal thin film.

Also, the Si substrate 1 is preferably a bulk single crystal substrate or a thin film substrate with an uppermost layer being Si. Also preferably, a plane equivalent to (111) or (100) of the Si substrate 1 is parallel to a surface of the Si substrate 1. Further, a film thickness of the active layer is preferably equal to or more than 0.1 µm and equal to or less than 5 µm.

Example 1

Figure 2:
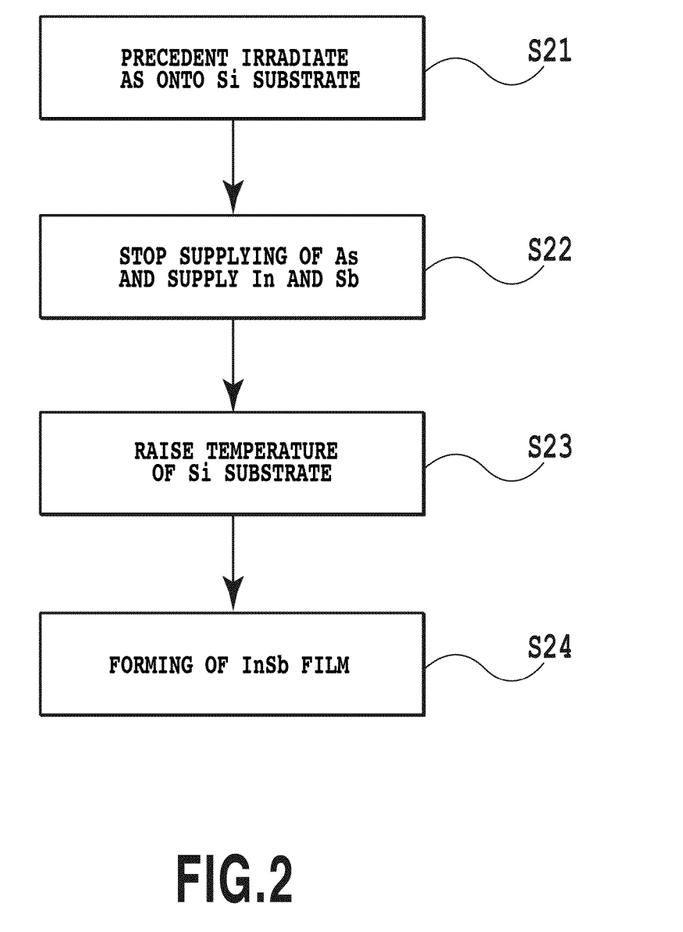
FIG. 2 is a process flow diagram for describing a manufacturing method according to Example 1 of a compound semiconductor lamination according to the present invention.

FIG. 2 is a process flow diagram for describing a manufacturing method according to Example 1 of a compound semiconductor lamination according to the present invention. First, a (111) Si substrate 1 of 4-inch diameter was cleaned and thereafter hydrogen-terminated by treatment with 1 wt % hydrofluoric acid. The Si substrate 1 was then introduced into a molecular beam epitaxial (MBE) apparatus. First, As was precedent irradiated at 390° C. for 3 seconds (step S21). The irradiation amount of As was set to a level of $10^{-5}$ Torr as flux measured by an ion gauge.

Next, the supplying of As was stopped, and supplying of In and Sb was started within one second (step S22) with In and Sb being supplied just at amounts for achieving a thickness of approximately 50 nm as film thickness of InSb. Then after raising the substrate temperature further to 420° C. (step S23), an InSb film 2 was formed so that the total film thickness became 0.8 µm (step S24).

Electrical characteristics of the InSb film 2 were measured by a known van der Pauw method. As a result, a sheet carrier concentration was $1.66\times10^{12}/cm^2$ and an electron mobility was 41,500 $cm^2/Vs$. If e is a charge of an electron and N is a carrier concentration, a Hall coefficient is 1/(en). The Hall coefficient (Rh) of the InSb film 3 obtained here was calculated to be 303 $cm^3/C$, and the result of division of Rh by the film thickness was 3,800,000 $cm^2/C$. The value disclosed in Patent Document 1 mentioned above is 800,00 $cm^2/C$ to 1,200,000 $cm^2/C$, and an improvement by three or more times the conventionally reported value was thus confirmed. That is, this indicates that the compound semiconductor lamination according to the present invention is significantly few in defects at the interface, and it was thus confirmed that by using this compound semiconductor lamination, it becomes possible to form a Hall element or an optical or electronic device that is difficult to form if there are many defects at the interface. The InSb film 2 is a mirror in outer appearance and was confirmed to be extremely flat by evaluation by an optical microscope.

Figure 5:
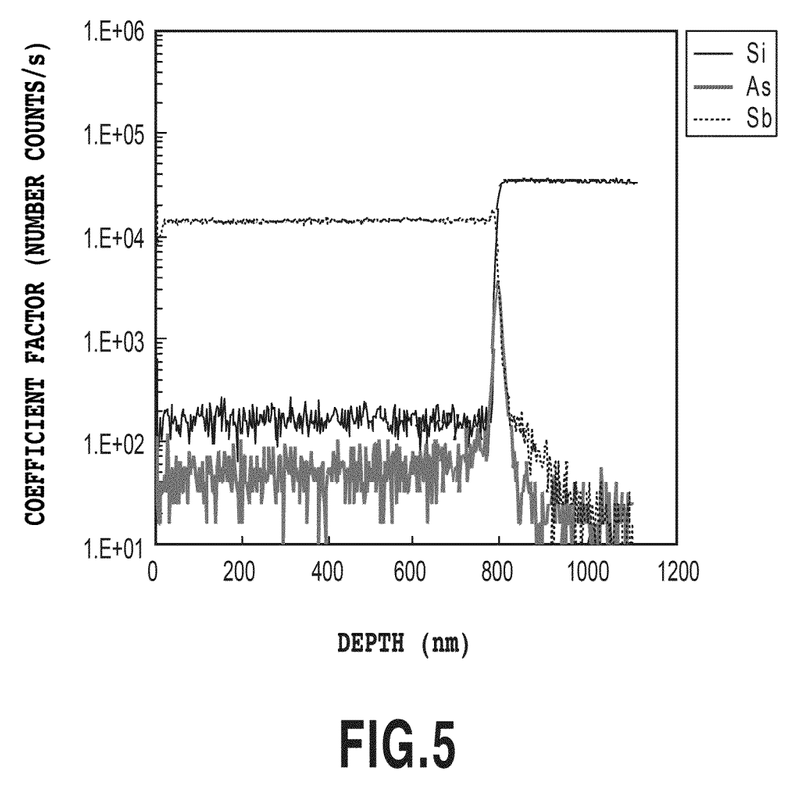
FIG. 5 is a diagram of measurement results of high-resolution SIMS.

The InSb film 2 was evaluated by high-resolution transmission electron microscopy (HRTEM). As a result, it was confirmed that there are no poly-crystals or amorphous material between the Si substrate 1 and the InSb film 2 and that the InSb is a single crystal film. Also, measurement results of a high-resolution SIMS (secondary ion-microprobe mass spectrometer) are shown in FIG. 5. The measurement conditions were as follows. That is, SIMS4100, made by Atomika Instruments GmbH, was used with a primary ion species being Cs+, an acceleration energy set to 2 keV, a primary ion current set to 8 nA, a primary ion beam incidence angle set to 60 deg (with 0 being the vertical angle), a scan width set to 200 µm, and detected ion species being $^{75}As^-$, $^{121}Sb^-$, and $^{30}Si_2^-$. In FIG. 5, the point at which an intensity of Sb becomes ½ and the point at which an intensity of Si becomes ½ are substantially matched, and it can be determined that the interface of the InSb film 2 and the Si substrate 1 is located there. It can be understood that As exhibits a maximum at the interface, and the intensity there far surpasses two times the intensity of As in the InSb film and indicates an intensity of several dozen times.

Comparative Example 1

A (111) Si substrate of 4-inch diameter was cleaned and thereafter hydrogen-terminated by treatment with 1 wt % hydrofluoric acid. The Si substrate was then introduced into the molecular beam epitaxial (MBE) apparatus. Without performing precedent irradiation of As, In and Sb were supplied at a substrate temperature of 420° C. and an InSb film of 0.7 µm was formed.

The electrical characteristics of the InSb film 2 were measured by the known van der Pauw method. As a result, the sheet carrier concentration was $3.5\times10^{12}/cm^2$ and the electron mobility was 8,400 $cm^2/Vs$. The Hall coefficient (Rh) of the InSb film obtained was calculated to be 124 $cm^3/C$. The result of division of Rh by the film thickness was 1,700,000 $cm^2/C$, and this result was thus far poorer in comparison to the example. The present film was evaluated by high-resolution transmission electron microscopy (HRTEM) and high-resolution SIMS (SIMS). By HRTEM, the presence of poly-crystals between the Si substrate 1 interface and the InSb film 2 was confirmed and it was thus confirmed that the InSb was not a single crystal. Also, from the results of SIMS, As was not detected at the interface of the Si substrate 1 and the InSb film 2.

Example 2

Figure 3:
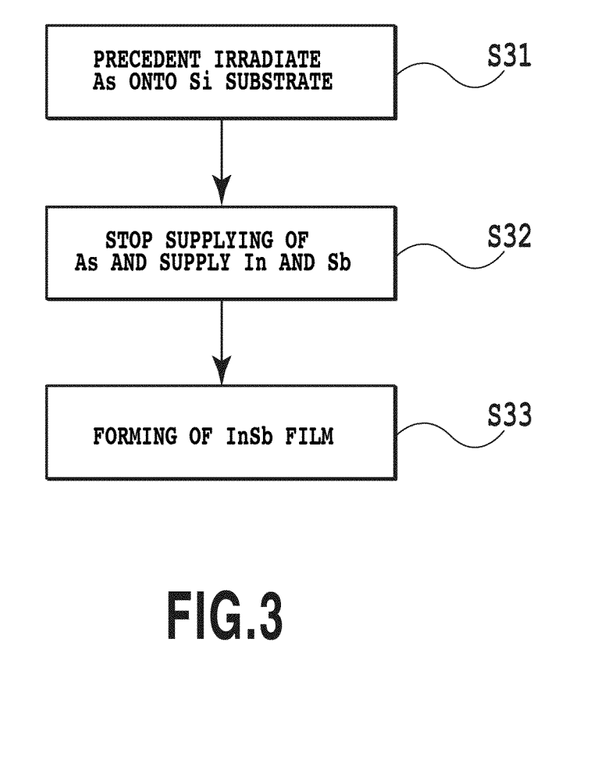
FIG. 3 is a process flow diagram for describing a manufacturing method according to Example 2 of a compound semiconductor lamination according to the present invention.

FIG. 3 is a process flow diagram for describing a manufacturing method according to Example 2 of a compound semiconductor lamination according to the present invention. First, a (111) Si substrate of 4-inch diameter was cleaned and thereafter hydrogen-terminated by treatment with 1 wt % hydrofluoric acid. The Si substrate 1 was then introduced into the molecular beam epitaxial (MBE) apparatus. First, As was precedent irradiated at a substrate temperature of 420° C. for 3 seconds (step S31). The irradiation amount of As was set to a level of $10^{-5}$ Torr as flux measured by the ion gauge.

Next, the supplying of As was stopped, and the supplying of In and Sb was started within one second (step S32) and an InSb film 2 of 0.7 μm thickness was formed (step S33). The steps from As irradiation to the end of growth of the InSb film 2 were carried out with the substrate temperature being kept at 420° C.

The electrical characteristics of the InSb film 2 were measured by the known van der Pauw method. As a result, the sheet carrier concentration was $1.65 \times 10^{12}/cm^2$ and the electron mobility was 33,200 $cm^2/Vs$. The Hall coefficient (Rh) of the InSb film 2 obtained was calculated to be 265 $cm^3/C$. The result of division of Rh by the film thickness was 3,800,000 $cm^2/C$ and confirmed to be better by two or more times the value of 800,00 $cm^2/C$ to 1,200,000 $cm^2/C$ indicated in Patent Document 1 mentioned above. The value was also confirmed to be better than that of the comparative example.

The InSb film 2 was evaluated by high-resolution transmission electron microscopy (HRTEM) and high-resolution SIMS (SIMS). By HRTEM, it was confirmed that there are no poly-crystals or amorphous material between the Si substrate 1 interface and the InSb film 2 and that the InSb is a single crystal film. Also, As was detected at the interface of the Si substrate 1 and the InSb film 2 from the results of SIMS.

Example 3

Figure 4:
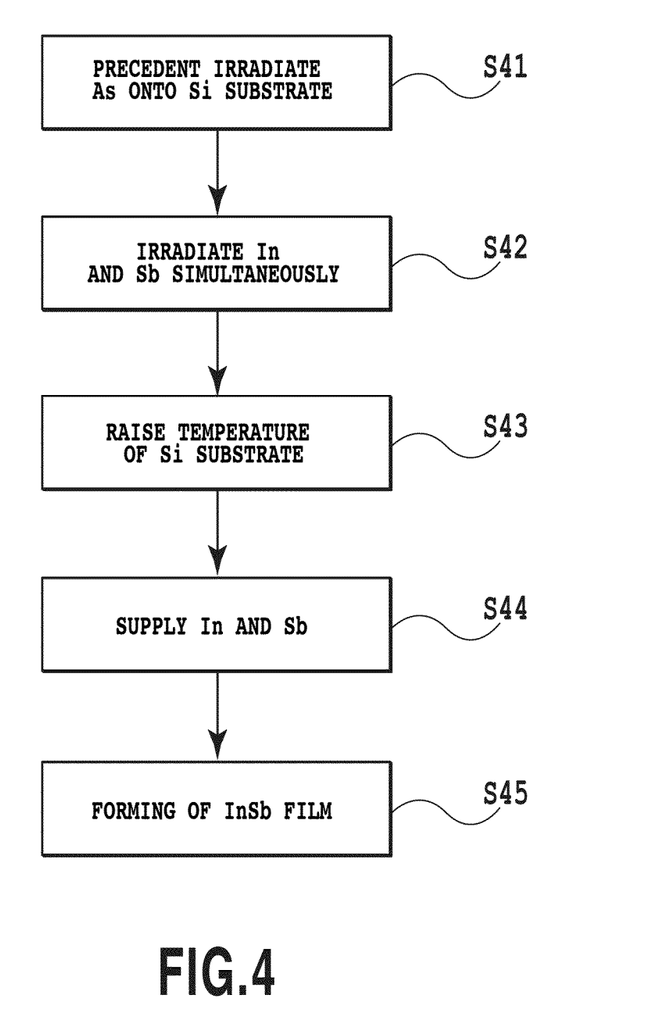
FIG. 4 is a process flow diagram for describing a manufacturing method according to Example 3 of a compound semiconductor lamination according to the present invention.

FIG. 4 is a process flow diagram for describing a manufacturing method according to Example 3 of a compound semiconductor lamination according to the present invention. First, a (111) Si substrate of 4-inch diameter was cleaned and thereafter hydrogen-terminated by treatment with 1 wt % hydrofluoric acid. The Si substrate 1 was then introduced into the molecular beam epitaxial (MBE) apparatus. First, As was precedent irradiated at a substrate temperature of 390° C. for 3 seconds (step S41). The irradiation amount of As at this time was set to the level of $10^{-5}$ Torr as flux measured by an ion gauge. After the elapse of one hour after the end of the precedent irradiation of As, In and Sb were irradiated simultaneously just at amounts for achieving a thickness of 50 nm (step S42), and then after raising the substrate temperature further to 420° C. (step S43), In and Sb were supplied (step 44) and an InSb film 2 with a total film thickness of 1 μm was formed (step S45).

The electrical characteristics of the InSb film 2 were measured by the known van der Pauw method. As a result, the sheet carrier concentration was $2.1 \times 10^{12}/cm^2$ and the electron mobility was 49,200 $cm^2/Vs$. The Hall coefficient (Rh) of the InSb film 2 obtained was calculated to be 298 $cm^3/C$. The result of division of Rh by the film thickness was 2,980,000 $cm^2/C$, and confirmed to be better by two or more times the value of 800,00 $cm^2/C$ to 1,200,000 $cm^2/C$ indicated in Patent Document 1 mentioned above. The value was also confirmed to be better than that of the comparative example.

The InSb film 2 was evaluated by high-resolution transmission electron microscopy (HRTEM) and high-resolution SIMS (SIMS). By HRTEM, it was confirmed that there are no poly-crystals or amorphous material between the Si substrate 1 interface and the InSb film 2 and that the InSb is a single crystal film. Also, As was detected at the interface of the Si substrate 1 and the InSb film 2 from the results of SIMS.

Example 4

Figure 6:
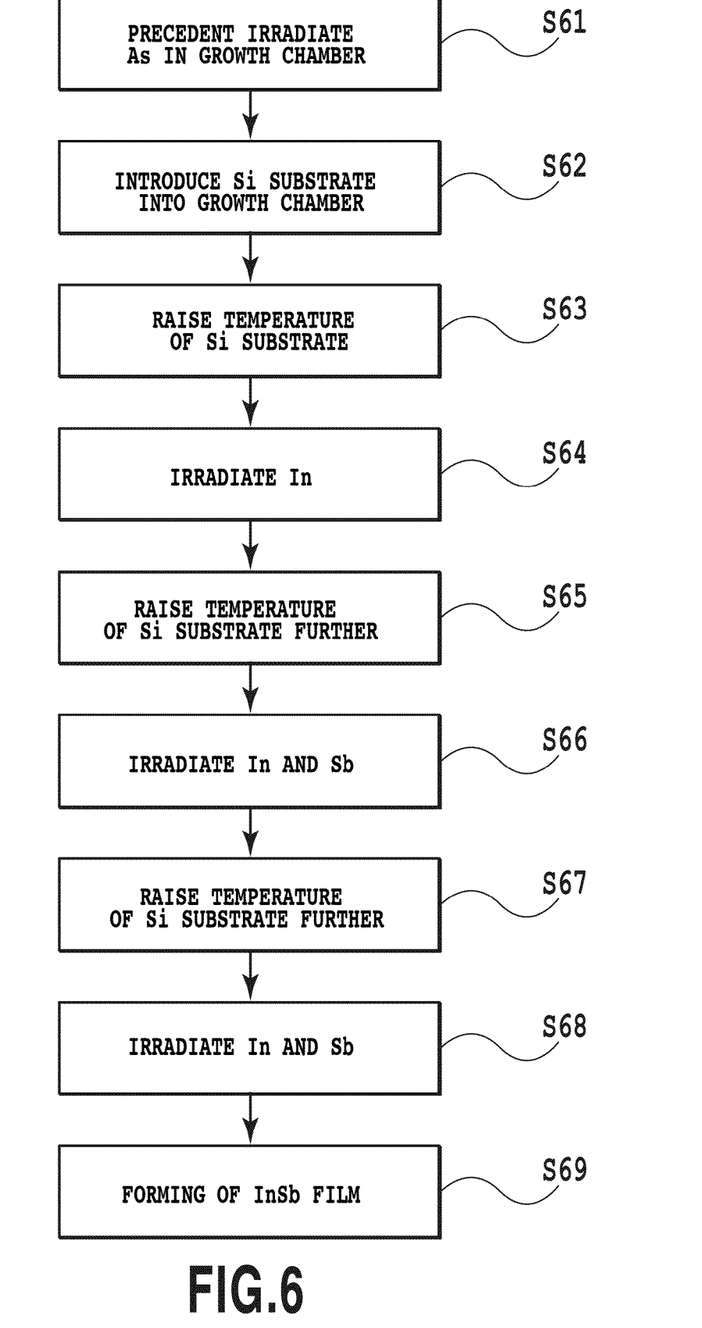
FIG. 6 is a process flow diagram for describing a manufacturing method according to Example 4 of a compound semiconductor lamination according to the present invention

FIG. 6 is a process flow diagram for describing a manufacturing method according to Example 4 of a compound semiconductor lamination according to the present invention. First, a (111) Si substrate of 4-inch diameter was cleaned and thereafter hydrogen-terminated by treatment with 1 wt % hydrofluoric acid. The Si substrate 1 was then introduced into the molecular beam epitaxial (MBE) apparatus. Before introducing the Si substrate into a growth chamber, As was supplied for 10 seconds to the growth chamber (step S61). The amount of As was set to the level of $10^{-5}$ Torr as flux measured by an ion gauge. The Si substrate was then introduced into the growth chamber (step S62). Then after raising the substrate temperature to 200° C. (step S63), In was irradiated for 4 seconds at an amount for achieving a thickness of 1 nm as InAs (step S64). The pressure of As immediately before In irradiation was $1 \times 10^{-8}$ mbar. The substrate temperature was then raised to 300° C. (step S65), In and Sb were irradiated simultaneously just at amounts for achieving a thickness of 50 nm (step S66), and then after raising the substrate temperature further to 420° C. (step S67), In and Sb were supplied (step S68) and an InSb film 2 with a total film thickness of 0.7 μm was formed (step S69).

The electrical characteristics of the InSb film 2 were measured by the known van der Pauw method. As a result, the sheet carrier concentration was $1.1 \times 10^{12}/cm^2$ and the electron mobility was 47,610 $cm^2/Vs$. The Hall coefficient (Rh) of the InSb film 2 obtained was calculated to be 398 $cm^3/C$. The result of division of Rh by the film thickness was 5,680,000 $cm^2/C$ and confirmed to be better by four or more times the value of 800,00 $cm^2/C$ to 1,200,000 $cm^2/C$ indicated in Patent Document 1 mentioned above. The value was also confirmed to be better than that of the comparative example.

The InSb film 2 was evaluated by high-resolution transmission electron microscopy (HRTEM) and high-resolution SIMS (SIMS). By HRTEM, it was confirmed that there are no poly-crystals or amorphous material between the Si substrate 1 interface and the InSb film 2 and that the InSb is a single crystal film. Also, As was detected at the Si substrate 1 interface and the InSb film 2 from the results of SIMS.

Also, measurement of the distribution of the electron mobility showed average ±3σ to be within average ±10%.

Comparative Example 2

The same experiment as that of Example 4 was performed with the omission of just step 61 in the process flow of FIG. 6. That is, first, a (111) Si substrate of 4-inch diameter was cleaned and thereafter hydrogen-terminated by treatment with 1 wt % hydrofluoric acid. The Si substrate 1 was then introduced into the molecular beam epitaxial (MBE) apparatus. Then after raising the substrate temperature to 200° C., In was irradiated for 4 seconds at an amount for achieving a thickness of 1 nm as InAs. The substrate temperature was then raised to 300° C., In and Sb were irradiated simultaneously just at amounts for achieving a thickness of 50 nm, and then after raising the substrate temperature further to 420° C., In and Sb were supplied and an InSb film 2 with a total film thickness of 0.7 μm was formed.

The electrical characteristics of the InSb film 2 were measured by the known van der Pauw method. As a result, the sheet carrier concentration was $2.81 \times 10^{12}/cm^2$ and the electron mobility was 8,957 cm²/Vs. The Hall coefficient (Rh) of the InSb film 2 obtained was calculated to be 156 cm³/C. The result of division of Rh by the film thickness was 2,220,000 cm²/C, and this result was thus far poorer in comparison to Example 4. The electron mobility result was also far poorer in comparison to Example 4. The present film was evaluated by high-resolution transmission electron microscopy (HRTEM) and high-resolution SIMS (SIMS). By HRTEM, the presence of poly-crystals between the Si substrate 1 interface and the InSb film 2 was confirmed and it was thus confirmed that the InSb was not a single crystal. Also, from the results of SIMS, As was not detected at the interface of the Si substrate 1 and the InSb film 2.

Example 5

Example of using a (100) Si substrate in the same process flow diagram as FIG. 2 was carried out. That is, first, the (100) Si substrate 1 of 4-inch diameter was cleaned and thereafter hydrogen-terminated by treatment with 1 wt % hydrofluoric acid. The Si substrate 1 was then introduced into the molecular beam epitaxial apparatus. First, As was precedent irradiated at 390° C. for 3 seconds. The irradiation amount of As was set to a level of $10^{-5}$ Torr as flux measured by an ion gauge. Next, the supplying of As was stopped and the supplying of In and Sb was started within one second with In and Sb being supplied just at amounts for achieving a thickness of approximately 50 nm as film thickness of InSb. Then after raising the substrate temperature further to 420° C., an InSb film 2 was formed so that the total film thickness became 0.7 μm. The electrical characteristics of the InSb film 2 were measured by the known van der Pauw method. As a result, the sheet carrier concentration was $1.2 \times 10^{12}/cm^2$ and the electron mobility was 33,000 cm²/Vs. The Hall coefficient (Rh) of the InSb film 2 obtained was calculated to be 365 cm³/C. The result of division of Rh by the film thickness was 5,210,000 cm²/C, and confirmed to be better by four or more times the value of 800,00 cm²/C to 1,200,000 cm²/C indicated in Patent Document 1 mentioned above. The value was also confirmed to be better than that of the comparative example.

The InSb film 2 was evaluated by high-resolution transmission electron microscopy (HRTEM) and high-resolution SIMS (SIMS). By HRTEM, it was confirmed that there are no poly-crystals or amorphous material between the Si substrate 1 interface and the InSb film 2 and that the InSb is a single crystal film. Also, As was detected at the interface of the Si substrate 1 and the InSb film 2 from the results of SIMS. Also, measurement of the distribution of the electron mobility showed average $\pm 3\sigma$ to be within average $\pm 10\%$.

Comparative Example 3

The same experiment as that of Example 5 was performed with the omission of just step 21 in the process flow of FIG. 2. That is, first, a (100) Si substrate 1 of 4-inch diameter was cleaned and thereafter hydrogen-terminated by treatment with 1 wt % hydrofluoric acid. The Si substrate 1 was then introduced into the molecular beam epitaxial apparatus. The supplying of In and Sb was started at 390° C., and In and Sb were supplied just at amounts for achieving a thickness of approximately 50 nm as film thickness of InSb. Then after raising the substrate temperature further to 420° C., an InSb film 2 was formed so that the total film thickness became 0.7 μm.

INDUSTRIAL APPLICABILITY

The present invention relates to a compound semiconductor lamination, a method for manufacturing the same, and a semiconductor device, and because As is present at the interface of the active layer and the single crystal layer of the Si substrate in the compound semiconductor lamination, formed by directly forming the active layer, which is the compound semiconductor that does not contain As, on the Si substrate, the forming of an InSb film on an Si substrate is enabled and applications can be developed industrially to magnetic sensors, such as Hall elements, magneto-resistance elements, etc., optical devices, such as infrared sensors, etc., and electronic devices, such as transistors, etc.

The invention claimed is:

1. A method for manufacturing a compound semiconductor lamination whereby a compound semiconductor layer is formed on an Si substrate, the method for manufacturing a compound semiconductor lamination comprising the steps of:
   hydrogen-terminating the Si substrate;
   precedent irradiating As onto the Si substrate before the terminally-attached hydrogen becomes desorbed;
   then irradiating a constituent substance of the compound semiconductor layer before the terminally-attached hydrogen becomes desorbed; and
   forming the compound semiconductor layer.

2. The method for manufacturing the compound semiconductor lamination according to claim 1, wherein, after forming a thin film by irradiating the constituent substance of the compound semiconductor layer onto the Si substrate, a temperature of the Si substrate is raised and then the constituent substance of the compound semiconductor layer is irradiated.

3. The method for manufacturing the compound semiconductor layer according to claim 1, wherein the Si substrate is a bulk single crystal substrate or a thin film substrate with an uppermost layer being Si.

4. A method for manufacturing a compound semiconductor lamination whereby a compound semiconductor layer is formed on an Si substrate, the method for manufacturing a compound semiconductor lamination comprising the steps of:
   hydrogen-terminating the Si substrate; then making As present in an ambient atmosphere without irradiating the As directly onto the Si substrate;
   irradiating a constituent substance of the compound semiconductor layer before the terminally-attached hydrogen becomes desorbed; and
   forming the compound semiconductor layer.

5. The method for manufacturing the compound semiconductor lamination according to claim 4, wherein, after forming a thin film by irradiating the constituent substance of the compound semiconductor layer onto the Si substrate, a temperature of the Si substrate is raised and then the constituent substance of the compound semiconductor layer is irradiated.

6. The method for manufacturing the compound semiconductor layer according to claim 4, wherein the Si substrate is a bulk single-crystal substrate or a thin film substrate with an uppermost layer being Si.

* * * * *